US012784848B2

(12) United States Patent
Wang et al.

(10) Patent No.: US 12,784,848 B2
(45) Date of Patent: Nov. 3, 2026

(54) METHODS AND APPARATUSES FOR OPERATING A MEMORY DEVICE

(71) Applicant: Yangtze Memory Technologies Co., Ltd., Wuhan (CN)

(72) Inventors: Hailong Wang, Wuhan (CN); Xueqing Huang, Wuhan (CN); Junyao Zhu, Wuhan (CN); Tianyu Wang, Wuhan (CN); Wei Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 37 days.

(21) Appl. No.: 18/797,461

(22) Filed: Aug. 7, 2024

(65) Prior Publication Data

US 2026/0011381 A1 Jan. 8, 2026

Related U.S. Application Data

(63) Continuation of application No. PCT/CN2024/103282, filed on Jul. 3, 2024.

(51) Int. Cl.

*G11C 16/06* (2006.01)
*G11C 16/04* (2006.01)
*G11C 16/10* (2006.01)
*G11C 16/34* (2006.01)

(52) U.S. Cl.

CPC ...... *G11C 16/3459* (2013.01); *G11C 16/0483* (2013.01); *G11C 16/102* (2013.01)

(58) Field of Classification Search

CPC ............ G11C 16/3459; G11C 16/0483; G11C 16/102

USPC ........................................ 365/185.22

See application file for complete search history.

(56) References Cited

U.S. PATENT DOCUMENTS

| | | | | |
|---|---|---|---|---|
| 9,552,885 | B2 * | 1/2017 | Shukla | G11C 11/5628 |
| 10,971,240 | B1 * | 4/2021 | Dunga | G11C 16/344 |
| 11,170,860 | B2 * | 11/2021 | Rori | G11C 16/32 |
| 11,894,077 | B2 * | 2/2024 | Zhang | G11C 16/3459 |
| 12,354,680 | B2 * | 7/2025 | Yang | G11C 11/5628 |
| 2008/0089132 | A1 | 4/2008 | Ito | |
| 2018/0130540 | A1 * | 5/2018 | Park | G11C 16/0483 |
| 2021/0280260 | A1 * | 9/2021 | Shiino | G11C 16/344 |
| 2022/0392552 | A1 * | 12/2022 | Pitner | G11C 16/24 |
| 2023/0268015 | A1 * | 8/2023 | Zhang | G11C 16/3459 365/185.22 |

(Continued)

FOREIGN PATENT DOCUMENTS

| | | | | |
|---|---|---|---|---|
| CN | 118942515 A | * 11/2024 | | G11C 16/06 |
| KR | 20140088386 A | * 7/2014 | | G11C 16/3454 |

OTHER PUBLICATIONS

International Search Report in International Appln. No. PCT/CN2024/103282, mailed on Nov. 28, 2024, 4 pages.

(Continued)

*Primary Examiner* — Viet Q Nguyen

(74) *Attorney, Agent, or Firm* — Hanley, Flight & Zimmerman, LLC

(57) ABSTRACT

Methods, devices, and systems for managing memory devices are provided. In one aspect, a method for operating a memory device includes programming a memory block of the memory device by programming each of a set of memory strings included in the memory block, and verifying the memory block by verifying less than all the set of memory strings in the memory block.

20 Claims, 11 Drawing Sheets

(56) References Cited

U.S. PATENT DOCUMENTS

| | | | | |
|---|---|---|---|---|
| 2023/0307053 | A1 | 9/2023 | Htet et al. | |
| 2024/0071532 | A1* | 2/2024 | Ameen Beshari | G11C 16/3427 |

OTHER PUBLICATIONS

Marotta et al., "Nonvolatile memory technologies with emphasis on flash: a comprehensive guide to understanding and using flash memory devices," John Wiley & Sons, IEEE, Jan. 2008, Chapter 3, pp. 63-128.

Communication pursuant to Article 94(3) EPC in European Appln. No. 24743691.8, mailed on Apr. 13, 2026, 7 pages.

* cited by examiner

METHODS AND APPARATUSES FOR OPERATING A MEMORY DEVICE

CROSS-REFERENCE TO RELATED APPLICATIONS

This application is a continuation of International Application No. PCT/CN2024/103282, filed on Jul. 3, 2024, the disclosure of which is hereby incorporated by reference in its entirety.

TECHNICAL FIELD

The present disclosure generally relates to memory devices and memory systems, and in particular, to managing program time in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, program (write) and erase operations, to change the threshold voltage of each memory cell to a respective level. For NAND flash memory, an erase operation can be performed at the memory block level, a program operation can be performed at the page level, and a read operation can be performed at the page level.

SUMMARY

The present disclosure involves methods, apparatuses, and systems for managing program time in memory devices. One aspect of the present disclosure features an example method for operating a memory device. The method includes programming a memory block of the memory device by programming each of a set of memory strings in the memory block, and verifying the memory block by verifying less than all the set of memory strings in the memory block.

In some implementations, the method further includes determining a number of failed memory cells in the less than all the set of memory strings in the memory block, and determining whether the programming of the memory block is successfully based on the number of failed memory cells.

In some implementations, programming the memory block includes programming the set of memory strings using a set of program pulses. Verifying the memory block includes verifying the less than all the set of memory strings using one or more verification pulses. A quantity of the one or more verification pulses is less than a quantity of the set of program pulses.

In some implementations, programming the memory block includes programming the set of memory strings by applying a set of program pulses to a word line coupled to memory cells of the set of memory strings. Verifying the memory block includes verifying only one memory string of all the set of memory strings by applying one verification pulse to the word line.

In some implementations, verifying less than all the set of memory strings in the memory block includes identifying one or more selected memory strings of the set of memory strings, and verifying the one or more selected memory strings by applying the one or more verification pulses.

In some implementations, the method further includes reading configuration data from a register of the memory device. The configuration data indicate the one or more selected memory string.

In some implementations, a first memory string of the less than all the set of memory strings is programmed using a first program pulse of the set of program pulses. The first memory string is verified using a first verification pulse of the one or more verification pulses, and the first verification pulse immediately follows the first program pulse.

In some implementations, the memory block includes single-level cells.

In some implementations, programming each of the set of memory strings included in the memory block includes applying a first program pulse to a word line to program first memory cells of a first memory string, and applying a second program pulse to the word line to program second memory cells of the second memory string. The word line is coupled to the first memory cells in the first memory string and the second memory cells in a second memory string. The first memory string and the second memory string are included the memory block. Verifying less than all the set of memory strings in the memory block includes applying a verification pulse to the word line to verify one of the first memory string or the second memory string. The second program pulse and the first program pulse are applied consecutively, and the verification pulse is applied after the second program pulse.

In some implementations, programming each of the set of memory strings includes, when applying the first program pulse, applying a first voltage to a first select line coupled to a first select gate transistor of the first memory string, and applying a ground voltage to a second select line coupled to a second select gate transistor of the second memory string.

In some implementations, programming each of the set of memory strings includes, when applying the second program pulse, applying the ground voltage to the first select line, and applying the first voltage to the second select line.

In some implementations, verifying less than all the set of memory strings in the memory block includes, when applying the verification pulse, applying a second voltage to one of the first select line or the second select line, and applying the ground voltage to another one of the first select line or the second select line.

In some implementations, the second voltage is higher than the first voltage.

One aspect of the present disclosure features a memory device. The memory device includes a memory array including a memory block that includes a set of memory strings, and a peripheral circuit coupled to the memory array. The peripheral circuit is configured to perform operations including programming the memory block by programming each of the set of memory strings, and verifying the memory block by verifying less than all the set of memory strings.

In some implementations, the operations further include determining a number of failed memory cells in the less than all the set of memory strings in the memory block, and determining whether the programming of the memory block is successfully based on the number of failed memory cells.

In some implementations, programming the memory block includes programming the set of memory strings using a set of program pulses. Verifying the memory block includes verifying the less than all the set of memory strings using one or more verification pulses. A quantity of the one or more verification pulses is less than a quantity of the set of program pulses.

In some implementations, programming the memory block includes programming the set of memory strings by applying a set of program pulses to a word line coupled to memory cells of the set of memory strings. Verifying the memory block includes verifying only one memory string of all the set of memory strings by applying one verification pulse to the word line.

In some implementations, verifying less than all the set of memory strings in the memory block includes identifying one or more selected memory strings of the set of memory strings, and verifying the one or more selected memory strings by applying the one or more verification pulses.

In some implementations, the method further includes reading configuration data from a register of the memory device. The configuration data indicate the one or more selected memory string.

One aspect of the present disclosure features a memory system. The memory system includes a memory device and a memory controller coupled to the memory device and configured to control the memory device. One aspect of the present disclosure features a memory device. The memory device includes a memory array including a memory block that includes a set of memory strings, and a peripheral circuit coupled to the memory array. The peripheral circuit is configured to perform operations including programming the memory block by programming each of the set of memory strings, and verifying the memory block by verifying less than all the set of memory strings in the memory block.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

Like reference numbers and designations in the various drawings indicate like elements.

DETAILED DESCRIPTION

This specification relates to memory devices, memory systems, and methods for managing program time in flash memory. Flash memory, such as NAND flash memory with single-level cells (SLCs) is known for its high reliability and fast program speed, and is widely used in applications such as aerospace and cache programming. As the demand for improved performance at a system level continues to rise, NAND flash memory with SLCs needs to have faster program speed by reducing program time.

In some cases, NAND flash memory with SLCs implements a one-program-one verification (1P1V) programming method, where each memory string is verified using a verification pulse after the memory string is programmed using a program pulse. The 1P1V programming method may require a relatively long program time, which can affect the program speed of the memory device.

The present disclosure provides techniques to reduce program time in NAND flash memory with SLCs. Since memory strings in NAND flash memory with SLCs are largely similar to one another, a result of whether a single memory string is successfully programmed can be used to represent whether a set of memory strings (e.g., a set of memory strings included in a memory block) are successfully programmed. In some implementations, after the set of memory strings in a memory block are programmed, less than all the set of memory strings are verified. In some implementations, after programming the set of memory strings in the memory block using a set of program pulses, only one memory string is verified using a verification pulse. For example, programming the set of memory strings includes applying the set of program pulses to a selected word line coupled to memory cells of the set of memory strings, and verifying the only one memory string includes applying the verification pulse to the selected word line. The memory device can determine whether the set of memory strings are successfully programmed based on a verification result from verifying one memory string of the set of memory strings. For another example, more than one memory string of the set of memory strings are selected for verification, while the rest of the set of memory strings are not verified.

In some implementations, the memory device can receive configuration data indicating the one or more memory strings selected for verification after they are programmed, while maintaining the option to verify all the set of memory strings.

In some implementations, the described techniques can achieve one or more technical effects. For example, the described techniques can reduce the program time of the NAND flash memory with SLCs, achieve a faster program speed of the memory device, without affecting the performance margins. In some implementations, additional or different technical effects can be achieved.

Figure 1:
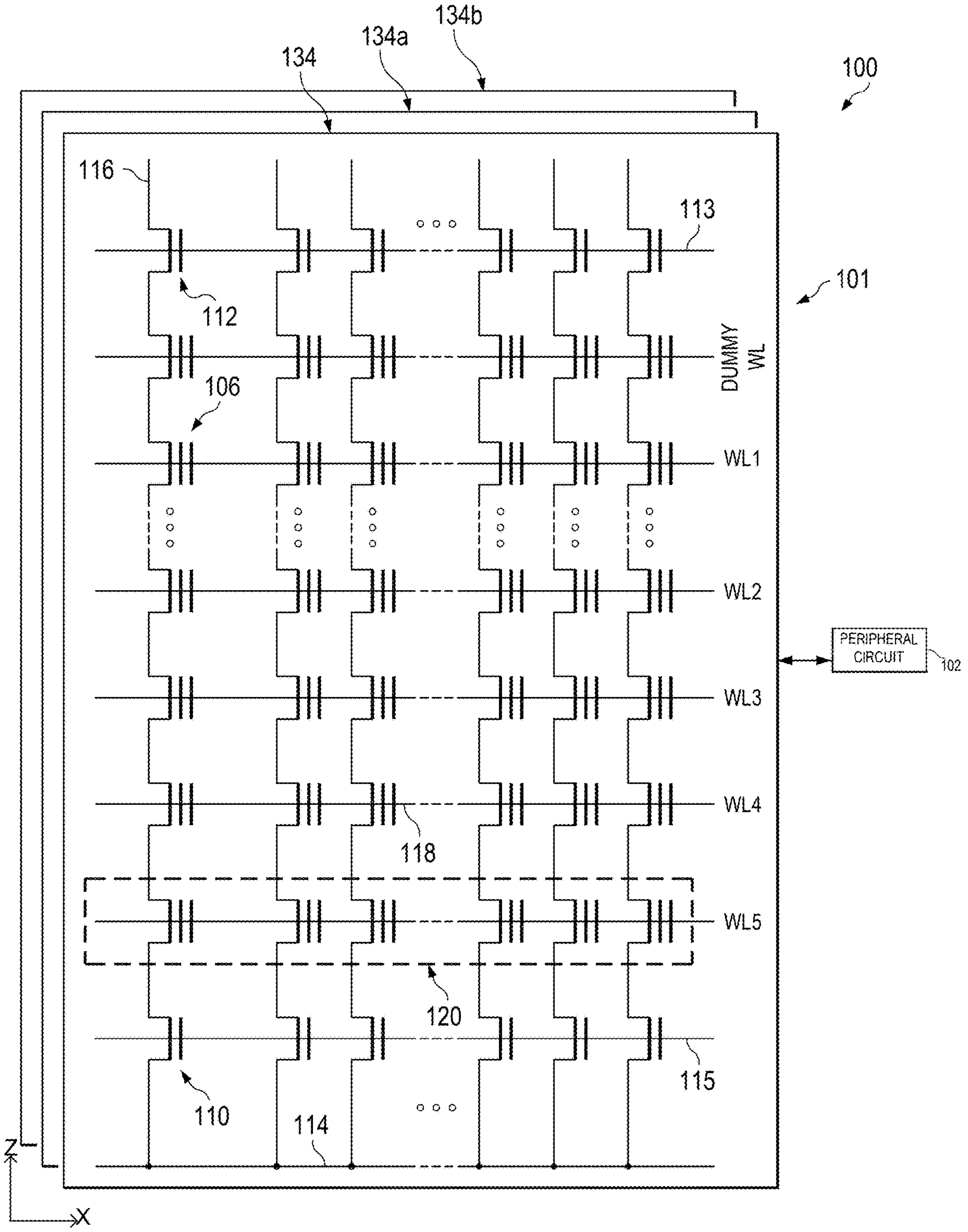
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. The memory device 100 can include a memory array 101 and peripheral circuits 102 coupled to the memory array 101. The memory array 101 can be a NAND flash memory array that includes NAND memory cells 106 arranged in rows and columns. In some implementations, memory cells 106 in a column (e.g., along z direction) of the memory array 101 are coupled in series and stacked vertically. Memory cells 106 in a row (e.g., along x direction) of the memory array 101 are coupled to and controlled by a word line 118. Each memory cell 106 can hold a continuous, analog value, such as an electrical voltage or charge that depends on the number of electrons trapped within a storage layer of the memory cell 106. The logic state (i.e., data) of each memory cell 106 can be determined based on the threshold voltage Vth of the memory cell 106. Each memory cell 106 can be a floating gate type memory cell including a floating-gate transistor, or a charge trap type memory cell including a charge-trap transistor.

In some implementations, each memory cell 106 is a single-level cell (SLC) with two possible memory states that can store one bit of data. For example, the first memory state “0” (e.g., erased state) can correspond to a first range of voltages, and the second memory state “1” (e.g., programmed state) can correspond to a second range of voltages. In some implementations, to increase storage capacity, each memory cell 106 can a multi-level cell (MLC), a triple-level cell (TLC), or a quad-level cell (QLC). An MLC stores 2 bits of data, and has four logic states, logic {11, 10, 01, and 00}, i.e., erased state, and programmed states P1, P2, and P3. A TLC stores 3 bits of data, and has eight logic states, logic {111, 110, 101, 100, 011, 010, 001, 000}, i.e., erased state, and programmed states P1-P7. A QLC stores 4 bits of data and has 16 logic states, logic {1111, 1110, 1101, 1100, 1011, 1010, 1001, 1000, 0111, 0110, 0101, 0100, 0011, 0010, 0001, 0000}, i.e., erased state and programmed states P1-P15.

As shown in FIG. 1, memory cells 106 in a column of the memory array 101 can be coupled to a source select gate (SSG) transistor 110 at its source end, and a drain select gate (DSG) transistor 112 at its drain end. The SSG transistor 110 and the DSG transistor 112 can be configured to activate selected columns of the memory array 101 during read and program operations. In some implementations, sources of the SSG transistors in the same memory block are coupled through a same source line 114. The drain of each DSG transistor is coupled to a respective bit line 116. From the bit line 116, data can read from, or written to memory cells in the column of memory array 101. In some implementations, each column of the memory array 101 is configured to be selected or deselected by applying a DSG select voltage or a DSG unselect voltage to the gate of the respective DSG transistor 112 through one or more DSG lines 113, and/or by applying a select voltage or a unselect voltage to the gate of the respective SSG transistor 110 through one or more SSG lines 115.

In some implementations, memory cells of adjacent columns can be coupled through word lines 118. The word line 118 can select which row of the memory array 101 is affected by read and program operations. In some implementations, the memory cell 106 is a SLC, and each word line 118 is coupled to a physical page 120 of memory cells 106, which is the basic data unit for program operations. The size of one physical page 120 in bits is associated with the number of columns of memory cells coupled by word line 118 in a memory block. Each word line 118 can include a gate line coupled to a plurality of control gates (gate electrodes) of a plurality of memory cells 106 in the respective physical page 120. Example word lines shown in FIG. 1 include WL0, WL1, WL2, WL3, WL4, and WL5 that are between DSG line 113 and SSG line 115. In some implementations, the word lines can further include dummy word lines coupled to dummy memory cells.

In some implementations, the memory array 101 can include a plurality of memory blocks, and each memory block can include a plurality of memory strings 134, **134*a*, 134*b*. As shown in FIG. 1, each memory string 134, 134*a*, 134*b* can include memory cells 106 arranged in rows (e.g., coupled to word lines along x direction) and in columns (e.g., connected in series along z direction). SSG lines 115 of different memory strings 134, 134*a*, 134*b* in the same memory block are coupled together, so that each memory block can be selected or deselected by applying a select voltage or an unselect voltage to the SSG lines 115. DSG lines 113 of different memory string 134, 134*a*, 134*b* are separate from each other, so that each memory string 134, 134*a*, 134*b* in the memory block can be selected or deselected by applying a select voltage or an unselect voltage to the respective DSG lines 113. For example, a first memory string 134 can be selected for programming by applying a select voltage to the DSG line 113; a second memory string 134*a* can be selected for programming by applying a select voltage to a second DSG line (not shown in FIG. 1) coupled to DSG transistors in the memory string 134*a*; and a third memory string 134*b* can be selected for programming by applying a select voltage to a third DSG line (not shown in FIG. 1) coupled to DSG transistors in the memory string 134*b***.

Peripheral circuits 102 can be coupled to memory array 101 through bit lines 116, word lines 118, source lines 114, SSG lines 115, and DSG lines 113. Peripheral circuits 102 can include any suitable analog, digital, and mixed-signal circuits for facilitating the operations of memory array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies.

Figure 2:
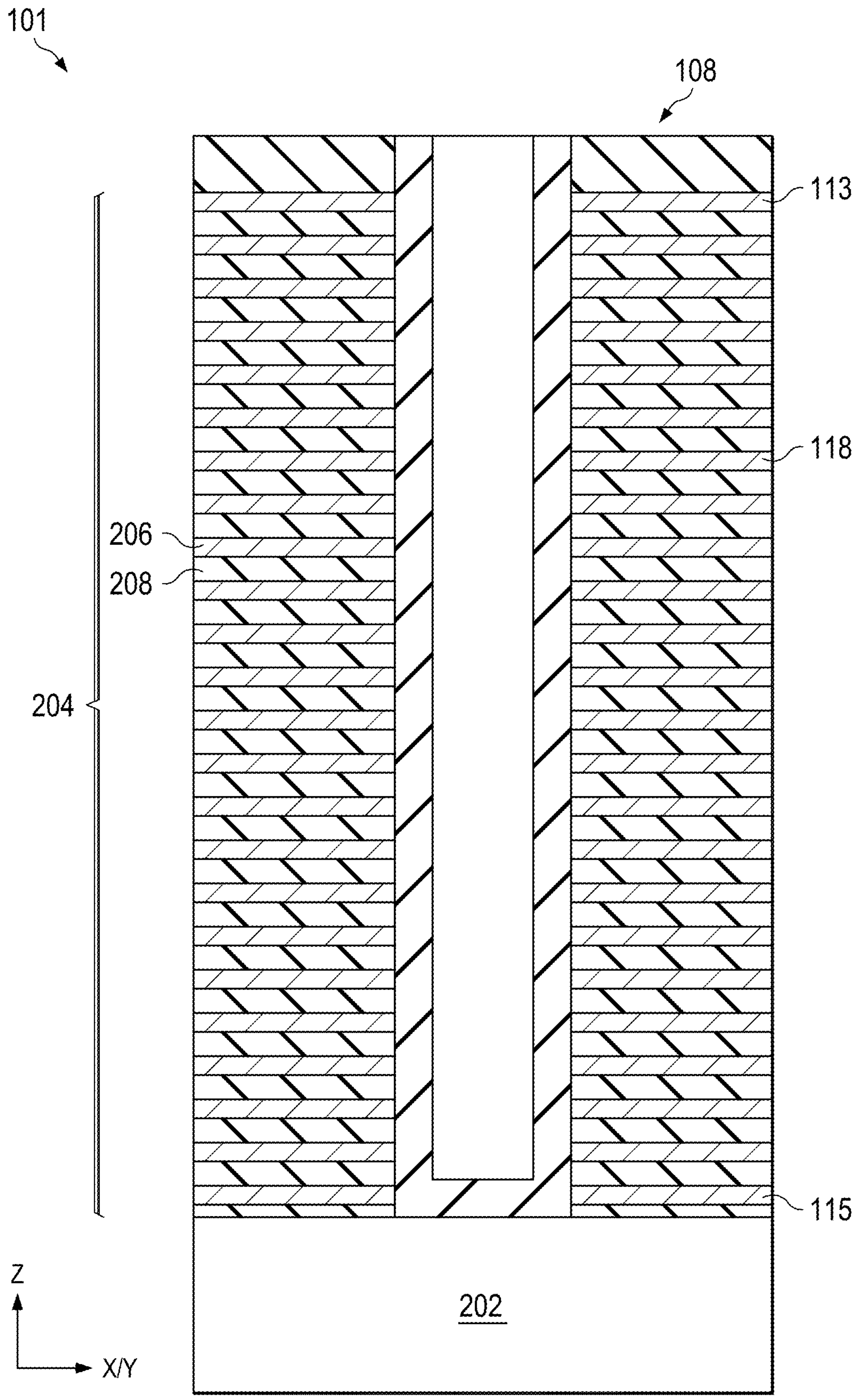
FIG. 2 illustrates an example of a side view of cross-sections of a memory array including memory strings, according to some aspects of the present disclosure.

FIG. 2 illustrates an example of a side view of cross-sections of a memory array 101, according to some aspects of the present disclosure. As shown in FIG. 2, memory cells 106 in a column of memory array 101 can be coupled in series and extend vertically through a memory stack 204 above a substrate 202. The substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

The memory stack 204 can include pairs of interleaved gate conductive layers 206 and gate-to-gate dielectric layers 208. The quantity of the pairs of the interleaved gate conductive layers 206 and gate-to-gate dielectric layers 208 in a memory stack 204 can determine the quantity of memory cells 106 in the memory array 101. The gate conductive layer 206 can include conductive materials including, but not limited to, one or more of tungsten (W), cobalt (Co), copper (Cu), aluminum (Al), polysilicon, doped silicon, or silicide. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, the DSG transistor 112, or the SSG transistor 110, and can extend laterally as the DSG line 113 at the top of memory stack 204, the SSG line 115 at the bottom of memory stack 204, or the word lines 118 between the DSG line 113 and the SSG line 115.

Figure 3:
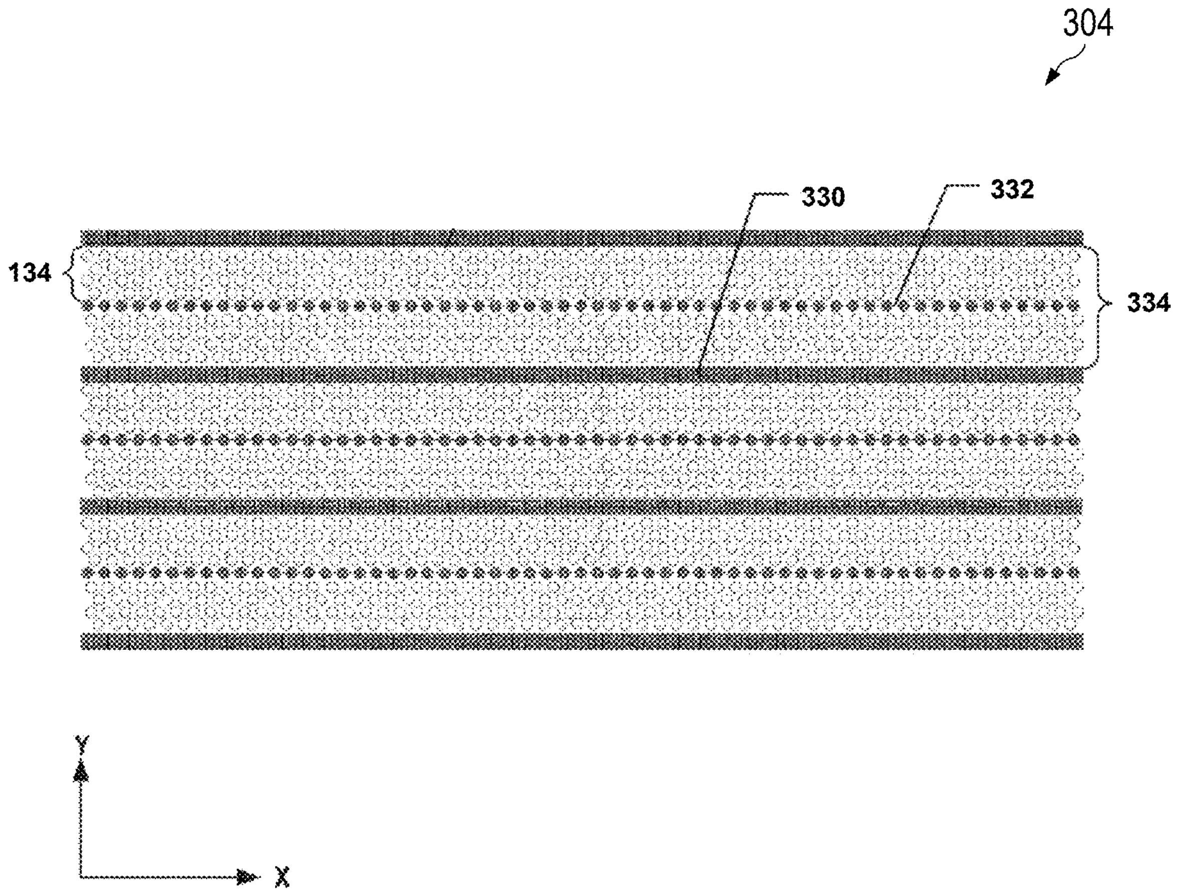
FIG. 3 illustrates an example of a schematic diagram of a memory cell memory block including memory strings, according to some aspects of the present disclosure.

FIG. 3 illustrates an example of a plan view of cross-sections of a memory block 304 of a memory array (e.g., memory array 101 of FIG. 1), according to some aspects of the present disclosure. In some implementations, each memory block 304 can serve as a basic data unit for erase operations, such that memory cells 106 on the same memory block 304 are erased at the same time. To erase memory cells 106 in a selected memory block 304, the source lines (e.g., source line 114 of FIG. 1) coupled to the selected memory block 304 and unselected memory blocks in the same plane can be biased with an erase voltage. For example, the erase voltage can be a high positive voltage (e.g., 20 V or more). In some implementations, an erase operation can be performed at a half-memory block level, a quarter-memory block level, or a level having any suitable number of memory blocks or fractions of a memory block.

In some implementations, the memory block 304 can include a plurality of memory strings 134. The memory strings 134 are separated between each other by DSG cuts 332, which can electrically separate DSG lines 113 of different memory strings 134. As such, each memory string 134 can be individually selected or deselected by applying DSG voltages to respective DSG lines 113. In some implementations, the memory strings 134 can be arranged into fingers 334 by SSG cuts 330, which are electrically separate SSG lines 115 of different fingers 334. As such, each finger 334 can be individually selected or deselected by applying SSG voltage to respective SSG lines 115. As an example shown in FIG. 3, the memory block 304 includes three fingers 334 separated by SSG cuts 330, and each finger 334 includes two memory strings 134 separated by DSG cuts 332. In some implementations, the memory block 304 can include a different number of fingers 334, and each finger 334 can include a different number of memory strings 134. In some implementations, the memory block 304 does not include SSG cuts 330, and SSG lines 115 of all memory strings 134 in the memory block 304 are electrically connected. As such, by applying select or unselect voltage to SSG lines in the memory block 304, the entire memory block 304 can be selected or deselected.

Figure 4:
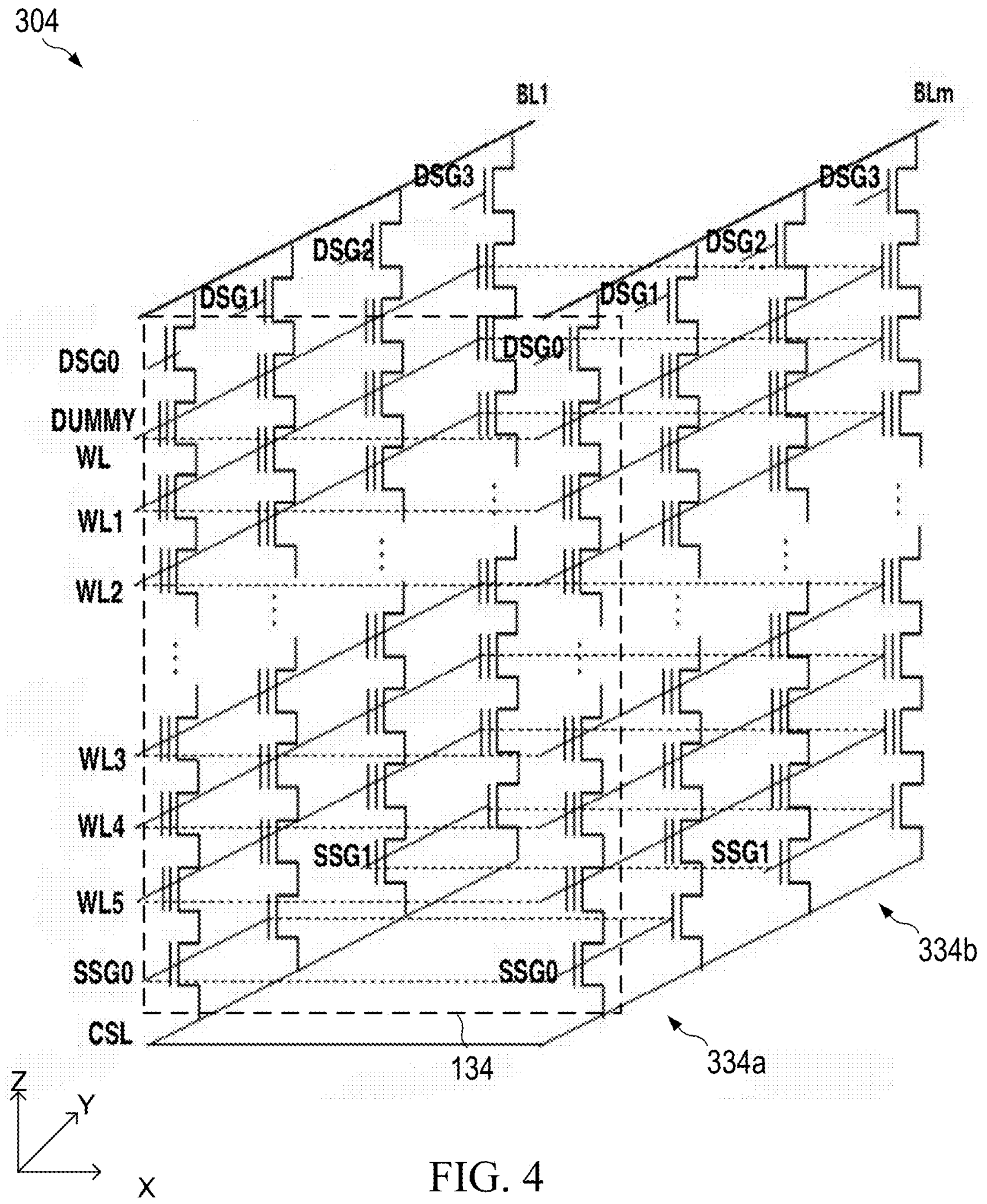
FIG. 4 illustrates an example of a plan view of cross-sections of a memory block of a memory array, according to some aspects of the present disclosure.

FIG. 4 illustrates an example of a schematic diagram of a memory block 304 of the memory array 101. The memory block 304 can include memory strings 134 according to some aspects of the present disclosure. In some implementations, memory block 304 can be divided into fingers 334*a*, 334*b*. Each finger 334 can include one or more memory strings 134. SSG transistors 110 of memory strings 134 in the same finger 334 are coupled to the same SSG line 115. For example, SSG transistors 110 of memory strings 134 of the first finger 334*a* are coupled to a first SSG line represented by SSG0; SSG transistors 110 of memory strings 134 of the second finger 334*b* are coupled to a second SSG line represented by SSG1.

In some implementations, DSG transistors 112 in the same memory string 134 are coupled to the same DSG line 113. For example, DSG transistors 112 of a first memory string in the memory block 304 are coupled to a first DSG line represented by DSG0; DSG transistors 112 of a second memory string in the memory block 304 are coupled to a second DSG line represented by DSG1; DSG transistors 112 of a third memory string in the memory block 304 are coupled to a third DSG line represented by DSG2; and DSG transistors 112 of a fourth memory string in the memory block 304 are coupled to a fourth DSG line represented by DSG3.

In some implementations, memory cells 106 in adjacent memory strings 134 can be coupled through word lines. Example word lines shown in FIG. 4 include Dummy WL, WL1, WL2, WL3, WL4, and WL5 between DSG line and SSG line. For example, memory cells 106 of the same vertical position (e.g., along z direction) in adjacent memory strings 134 are coupled to the same word line.

In some implementations, the memory block 304 can include a different number of fingers 334, and each finger 334 can include a different number of memory strings 134. In some implementations, the memory strings 134 are not arranged in to fingers 334, for example, by coupling SSG transistors of all memory strings 134 of the memory block 304 to the same SSG line.

Figure 5:
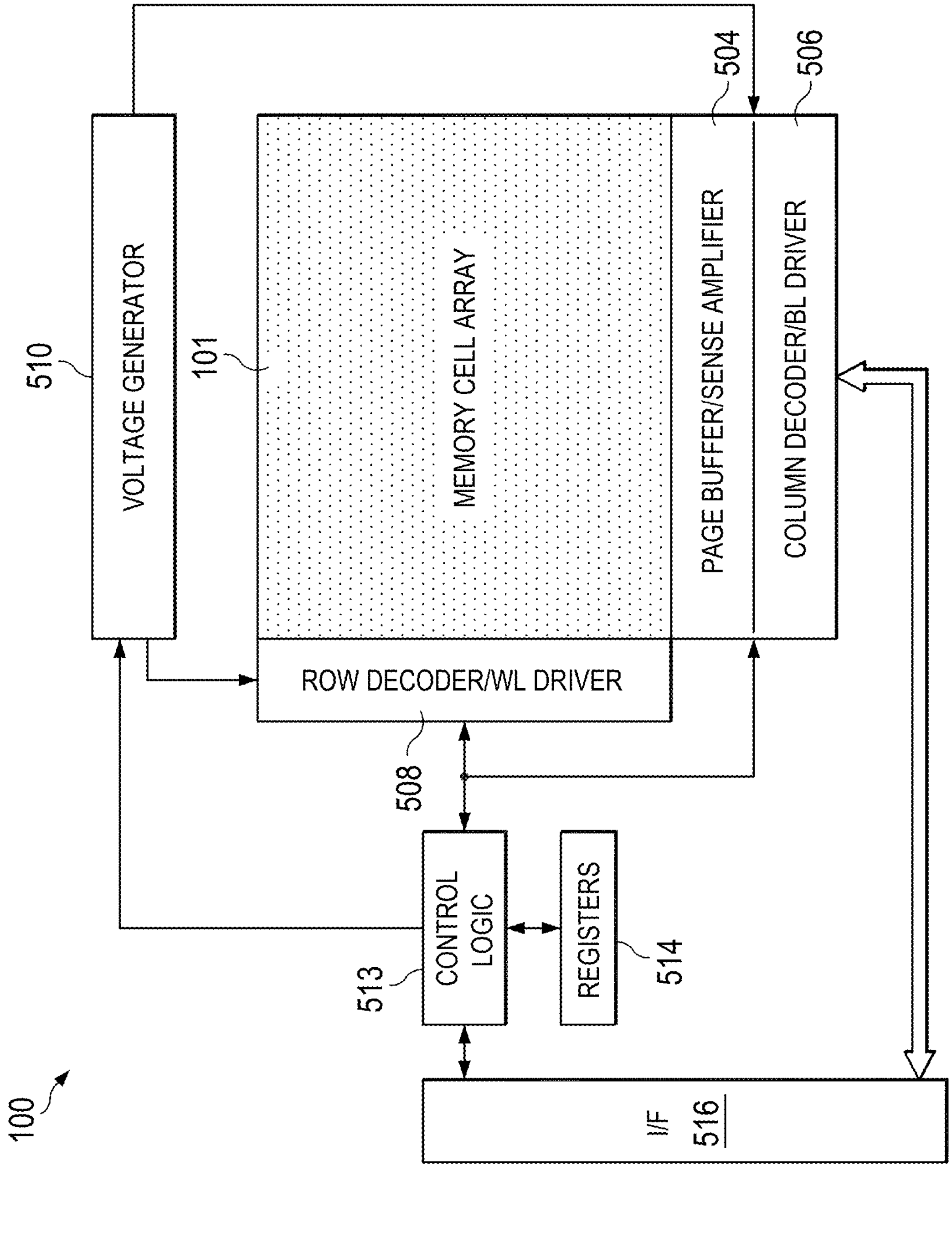
FIG. 5 illustrates some example peripheral circuits, according to some aspects of the present disclosure.

FIG. 5 illustrates some example peripheral circuits, according to some aspects of the present disclosure. The example peripheral circuits include a page buffer/sense amplifier 504, a column decoder/bit line driver 506, a row decoder/word line driver 508, a voltage generator 510, control logic 512, registers 514, an interface 516, and a data bus. In some examples, additional peripheral circuits not shown in FIG. 5 may be included as well.

The page buffer/sense amplifier 504 can be configured to read and program (write) data from and to memory array 101 according to the control signals from control logic 512. In an example, the page buffer/sense amplifier 504 may store one page of program data (write data) to be programmed into one page of the memory array 101. In another example, the page buffer/sense amplifier 504 may perform program verification operations to ensure that the data has been properly programmed into memory cells 106 coupled to selected word lines 118. In still another example, the page buffer/sense amplifier 504 may also sense the low power signals from the bit line 116 that represents a data bit stored in memory cell 106, and amplify the small voltage swing to recognizable logic levels in a read operation. The column decoder/bit line driver 506 can be configured to be controlled by the control logic 512 and select one or more memory strings 408, 418 by applying bit line voltages generated from the voltage generator 510.

The row decoder/word line driver 508 can be configured to be controlled by the control logic 512 and select/unselect memory blocks 304 of the memory array 101 and select/unselect word lines 118 of the memory block 304. The row decoder/word line driver 508 can be further configured to drive word lines 118 using word line voltages generated from the voltage generator 510. In some implementations, the row decoder/word line driver 508 can also select/unselect and drive SSG lines 115 and DSG lines 113. As described below in detail, the row decoder/word line driver 508 is configured to apply a program voltage to selected word line 118 in a program operation on memory cell 106 coupled to selected word line 118.

The voltage generator 510 can be configured to be controlled by the control logic 512 and generate the word line voltages (e.g., read voltage, program voltage, pass voltage, local voltage, verify voltage, etc.), bit line voltages, and source line voltages to be supplied to the memory array 101.

The control logic 512 can be coupled to each peripheral circuit described above and configured to control operations of each peripheral circuit. The registers 514 can be coupled to the control logic 512 and include status registers, command registers, and address registers for storing status information, command operation codes (OP codes), and command addresses for controlling the operations of each peripheral circuit.

The interface 516 can be coupled to the control logic 512 and act as a control buffer to buffer and relay control commands received from a host (not shown) to the control logic 512 and status information received from the control logic 512 to the host. The interface 516 can also be coupled to the column decoder/bit line driver 506 via a data bus, and act as a data input/output (I/O) interface and a data buffer to buffer and relay data to and from the memory array 101.

Figure 6A:
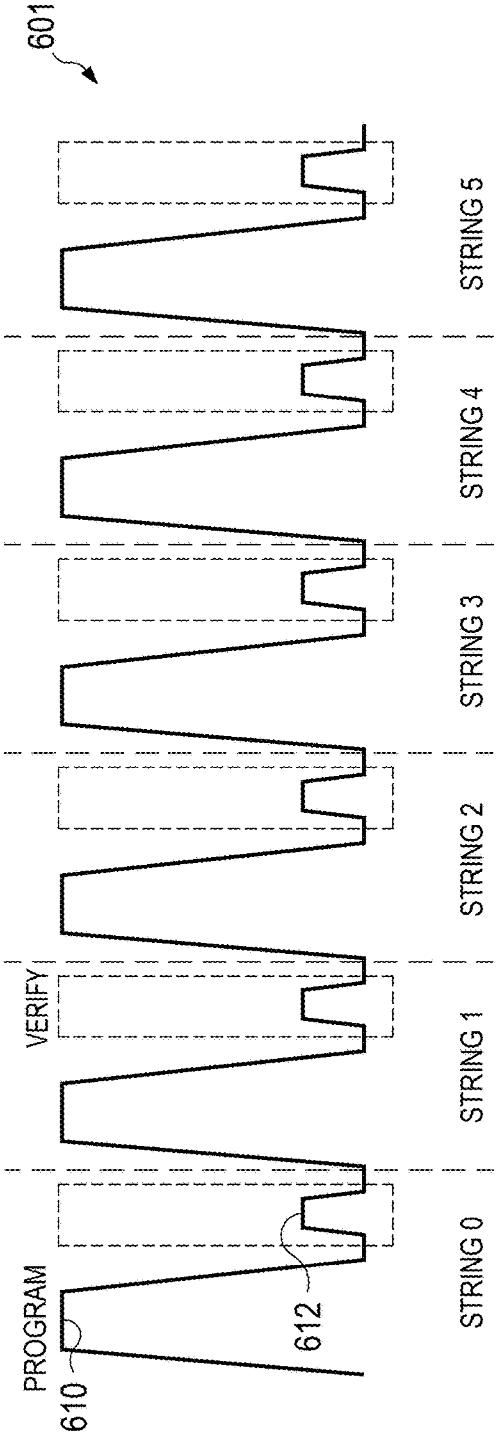
FIG. 6A illustrates an example pulse scheme to program memory strings in a memory block, according to some aspects of the present disclosure.
Figure 6B:
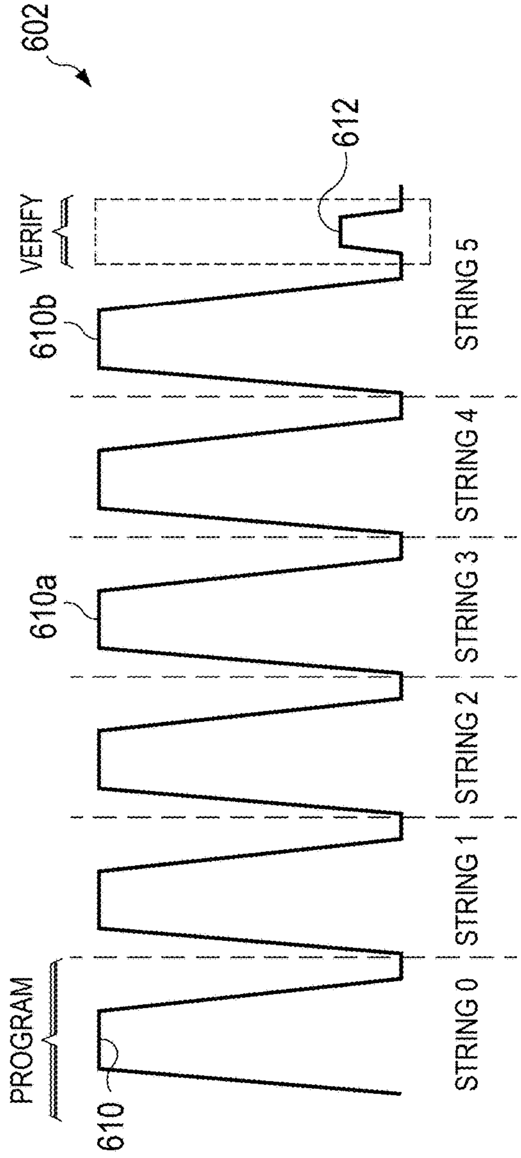
FIG. 6B illustrates another example pulse scheme to program memory strings in a memory block, according to some aspects of the present disclosure.

FIGS. 6A-6B illustrate example pulse schemes 601, 602 to program memory strings in a memory block, according to some aspects of the present disclosure. With reference to FIG. 4, memory cells in different memory string 134 of a memory block 304 are coupled by word lines. For example, memory cells of the same vertical position (e.g., along z direction) in each memory string 134 are coupled to the same word line. When programming the memory block 304, memory cells coupled to different word lines are programmed in order, for example, from top to bottom (e.g., from WL1 to WL5), or from bottom to top (e.g., from WL5 to WL1). When programming memory cells coupled to each word line (e.g., one of WL1 to WL5), a plurality of program pulses 610 are applied to the word line. Each program pulse is used to program memory cells of a respective memory string that are coupled to the word line. As one example, the memory block 304 can include 6 memory strings 134, e.g., memory strings 0-5. When programming the memory block 304, six program pulses 610 can be applied to each word line. Each of the six program pulses 610 is used to program memory cells in a respective memory string of the six memory strings. For example, a starting program pulse can be used to program memory string 0, and a sixth program pulse can be used to program memory string 5.

As shown in FIG. 6A, in the pulse scheme 601, each program pulse 610 is followed by a verification pulse 612. By applying the program pulse 610 to a word line, memory cells coupled to the word line can be programmed from an erased state to a programmed state. Each program pulse can have a program voltage (e.g., a voltage between 10 V and 30 V), and can have a pulse length (e.g., a time duration between 1 μs to 30 μs) during which the program voltage is applied. Each verification pulse can have a verification voltage (e.g., a voltage between −1.5V and 5V), and can have a pulse length (e.g., a time duration between 1 μs to 30 μs) during which the verification pulse 612 is applied. By applying the verification pulse 612 to the word line after the program pulse 610, the memory device can verify whether memory cells in a memory string have been successfully programmed to the programmed state. For example, by applying the verification pulses 612, the memory device can determine a number of failed memory cells in each memory string of the memory block, and determine whether each memory string is successfully programmed based on the number of failed memory cells. If the number of failed memory cells in a memory string is larger than a threshold, in some cases, the memory device can apply another program pulse to the word line to program the memory string again, or in some other cases, the memory device can report to a memory controller the failed memory string or the failed memory block where the failed memory string is in.

In some implementations, the program pulses are used to program SLCs having two possible states that correspond to one bit of information, and the program voltage and pulse length of each program pulse 610 in the pulse scheme 601 are the same. By applying a verification pulse 612 after each program pulse 610, the program time (e.g., time needed to apply the program pulses 610 and the verification pulses 612 in the pulse scheme 601) may be long, which can affect the speed and efficiency of the memory device.

As shown in FIG. 6B, in the pulse scheme 602, to reduce program time, less than all the memory strings in the memory block are verified when programming the memory block. The number of verification pulses 612 in the pulse scheme 602 is less than the number of program pulses 610. That is, only selected memory strings in the memory block are verified after being programed by the program pulse 610, while the rest of the memory strings are not verified. In some implementations, a selected memory string is verified, the result of which can represent whether all memory strings in the memory block have been successfully programmed. As one example, when programming a memory block that includes 6 memory strings, after applying 6 program pulses to a word line, one verification pulse 612*a* can be applied to the word line to verify whether memory cells in one of the 6 memory strings (e.g., memory string 5) have been successfully programmed to the programmed state. In some implementations, more than one selected memory string in the memory block is verified. For example, the selected memory strings for verification can include memory string 3. The verification pulse 612 for verifying memory string 3 can follow the last program pulse 610*b* of the pulse scheme 602, or can immediately follow the fourth program pulse 610*a* for programming memory string 3.

In the pulse scheme 602, by verifying one or more selected memory strings in the memory block, the memory device can determine a number of failed memory cells in the one or more selected memory strings, and determine whether the memory block is successfully programmed based on the number of failed memory cells. If the number of failed memory cells in the one or more memory strings is larger than a threshold, in some cases, the memory device can apply another set of program pulses to the word line to program all the memory strings in the memory block again, or in some other cases, the memory device can report to the memory controller the failed memory block.

In some implementations, the memory controller can send configuration data to the memory device that indicate which memory strings in the memory block are selected for verification. The memory device can store the configuration data, for example, in a register of the memory device. When performing a program operation, the memory device can read the configuration data from the register to identify the memory strings selected for verification. The selected memory strings are verified after being programmed.

In some implementations, the pulse schemes 601, 602 are used to program single-level cells (SLCs). In some other implementations, the pulse schemes 601 and 602 are used to program multi-level cells (MLCs), triple-level cells (TLCs), or quad-level cells (QLCs) operating in SLC modes, for example, worn-out MLCs, TLCs or QLCs that can be programmed and accessed as if they were SLCs.

Figure 7:
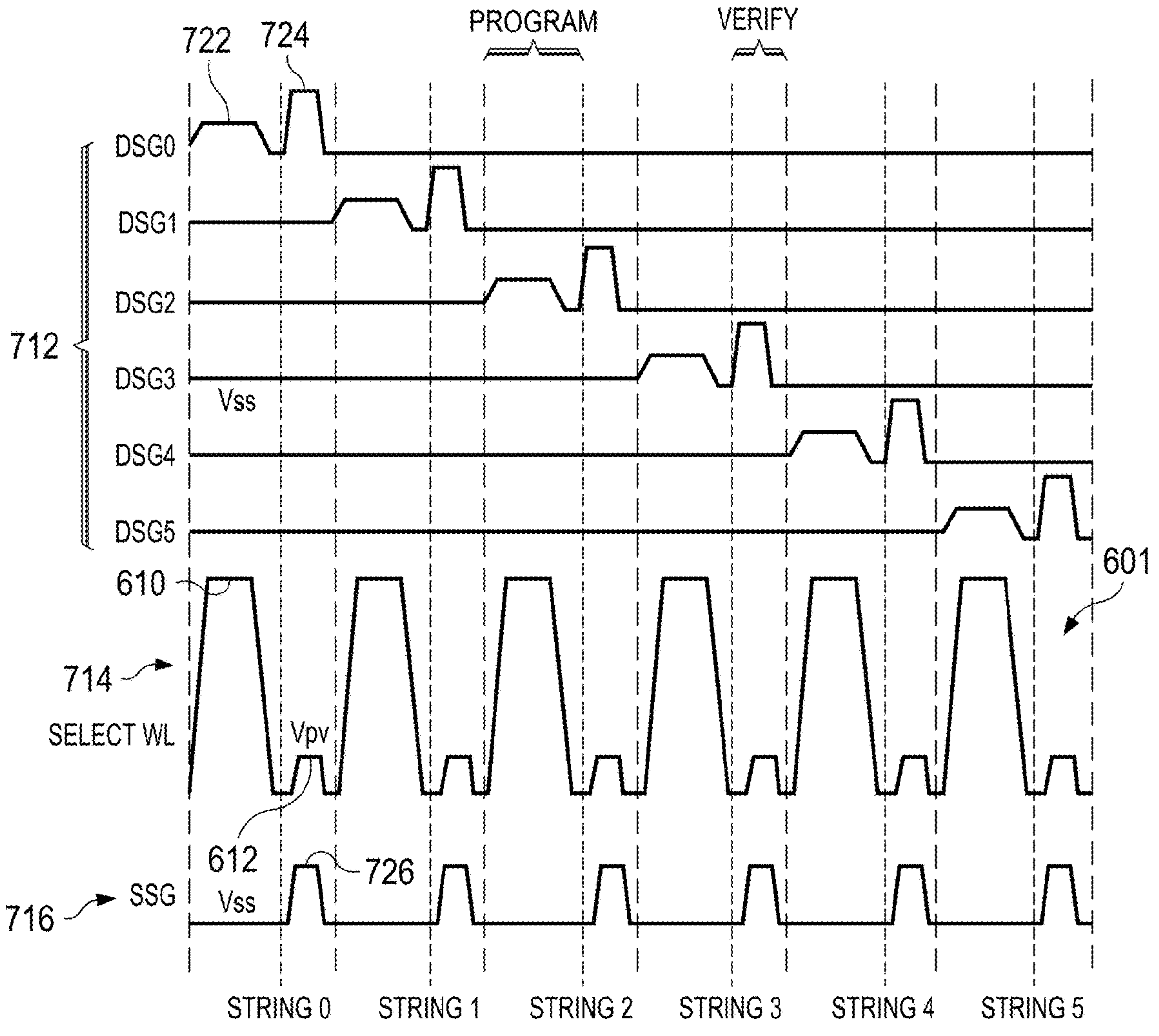
FIG. 7 illustrates an example of voltages of components in a memory block when applying the pulse scheme in FIG. 6A, according to some aspects of the present disclosure.

FIG. 7 illustrates an example of voltages of components in a memory block (e.g., memory block 304 of FIGS. 3-4) when applying the pulse scheme 601 in FIG. 6A, according to some aspects of the present disclosure. The memory block can include a set of memory strings (e.g., memory strings 134 of FIGS. 1, 2 and 4), for example, memory strings 0-5, each coupled to a DSG line 712 of DSG lines 0-5. All of the set of memory strings in the memory block are coupled to the same SSG line 716. Selected word line 714 represents a word line in the memory block selected for programming and verification.

The pulse scheme 601 is applied to the selected word line 714. The pulse scheme 601 includes a verification pulse 612 following each program pulse 610. When applying a program pulse 610 to the selected word line 714 to program a memory string (e.g., memory string 0) of the memory block, a first select voltage 722 is applied to the DSG line 712 of the memory string to turn on the DSG transistors in the memory string, while an unselect voltage (e.g., ground voltage) is applied to DSG lines 712 of other memory strings. As such, the memory string (e.g., memory string 0) can be selected for programming, while the other memory strings are deselected for programing. In addition, when applying a verification pulse 612 to the selected word line 714 to verify a memory string of the memory block, a second select voltage 724 is applied to the DSG line 712 of the memory string and a third select voltage 726 is applied to the SSG line 716, while an unselect voltage is applied to DSG lines 712 of other memory strings. As such, the memory string can be selected for verification, while the other memory strings are deselected for verification. In some implementations, the first select voltage 722, the second select voltage 724 and the third select voltage 726 can have the same or different voltage values. For example, the second select voltage 724 can be larger than the first select voltage 722.

As an example shown in FIG. 7, a memory block that includes 6 memory strings can be programmed and verified using 6 program pulses and 6 verification pulses. The first program pulse is applied to the selected word line 714 to program memory string 0. When applying the first program pulse in a first program interval, the first select voltage 722 is applied to DSG line 0 coupled to memory string 0. The first verification pulse is applied to the selected word line 714 to verify memory string 0. When applying the first verification pulse in a first verification interval, the second select voltage 724 is applied to DSG line 0, and the third select voltage 726 is applied to SSG line 716.

In another time interval, the second program pulse is applied to the selected word line 714 to program memory string 1. When applying the second program pulse, the first select voltage 722 is applied to DSG line 1 coupled to memory string 1. The second verification pulse is applied to the selected word line 714 to verify memory string 1. When applying the second verification pulse, the second select voltage 724 is applied to DSG line 1, and the third select voltage 726 is applied to SSG line 716.

In another time interval, the third program pulse is applied to the selected word line 714 to program memory string 2. When applying the third program pulse, the first select voltage 722 is applied to DSG line 2 coupled to memory string 2. The third verification pulse is applied to the selected word line 714 to verify memory string 2. When applying the third verification pulse, the second select voltage 724 is applied to DSG line 2, and the third select voltage 726 is applied to SSG line 716.

In another time interval, the fourth program pulse is applied to the selected word line 714 to program memory string 3. When applying the fourth program pulse, the first select voltage 722 is applied to DSG line 3 coupled to memory string 3. The fourth verification pulse is applied to the selected word line 714 to verify memory string 3. When applying the fourth verification pulse, the second select voltage 724 is applied to DSG line 3, and the third select voltage 726 is applied to SSG line 716.

In another time interval, the fifth program pulse is applied to the selected word line 714 to program memory string 4. When applying the fifth program pulse, the first select voltage 722 is applied to DSG line 4 coupled to memory string 4. The fifth verification pulse is applied to the selected word line 714 to verify memory string 4. When applying the fifth verification pulse, the second select voltage 724 is applied to DSG line 4, and the third select voltage 726 is applied to SSG line 716.

In another time interval, the sixth program pulse is applied to the selected word line 714 to program memory string 5. When applying the sixth program pulse, the first select voltage 722 is applied to DSG line 5 coupled to memory string 5. The sixth verification pulse is applied to the selected word line 714 to verify memory string 5. When applying the sixth verification pulse, the second select voltage 724 is applied to DSG line 5, and the third select voltage 726 is applied to SSG line 716.

In some implementations, the memory block can include a different number of memory strings. According to the number of memory strings, the memory block can include a different number of DSG lines 712, and the pulse scheme 601 can include a different number of program pulses and a different number of verification pulses.

Figure 8:
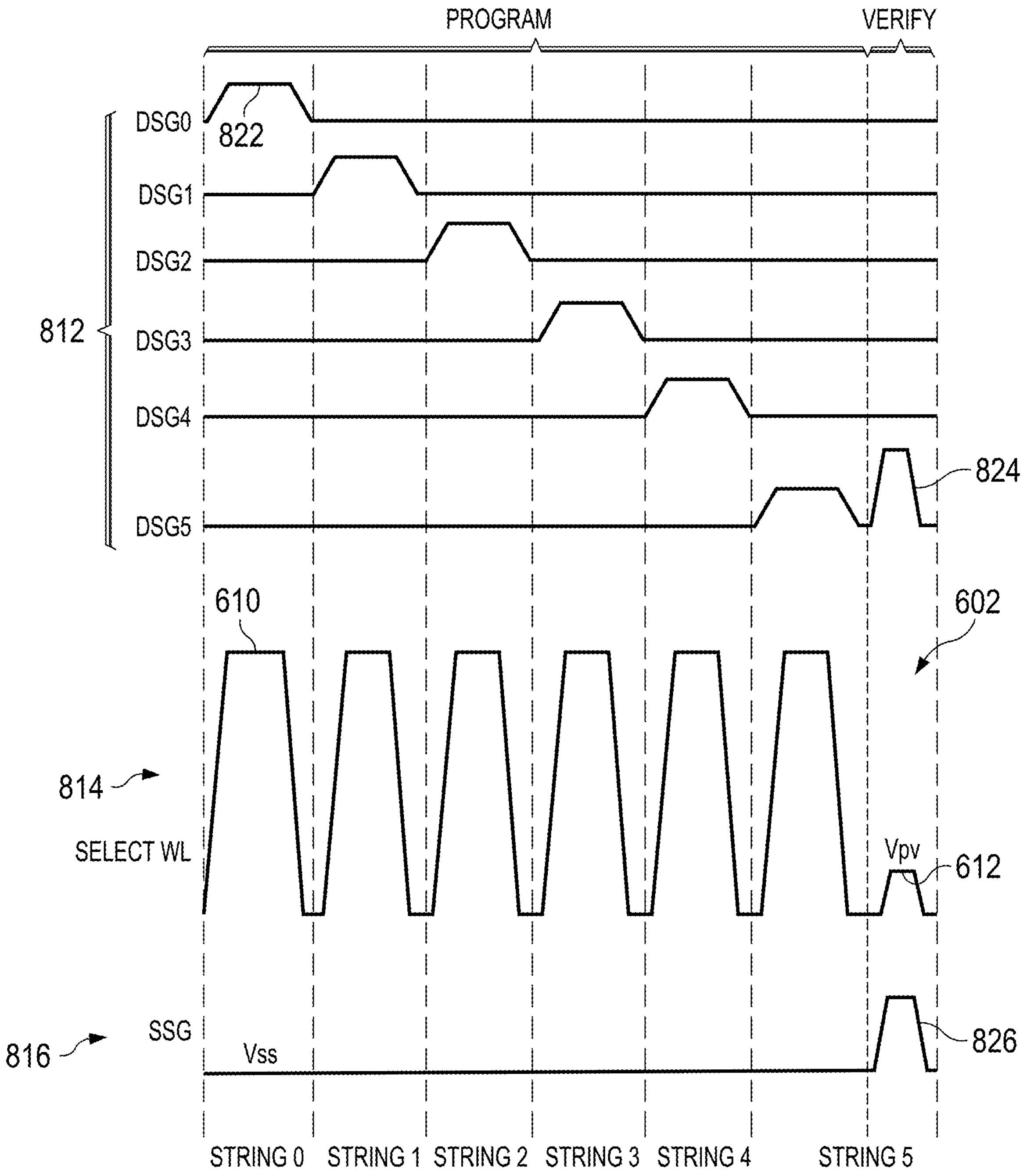
FIG. 8 illustrates an example of voltages of components in a memory block when applying the pulse scheme in FIG. 6B, according to some aspects of the present disclosure.

FIG. 8 illustrates an example of voltages of components in a memory block (e.g., memory block 304 of FIGS. 3-4) when applying the pulse scheme 602 in FIG. 6B, according to some aspects of the present disclosure. The memory block can include a set of memory strings (e.g., memory strings 134 of FIGS. 1, 2 and 4), for example, memory strings 0-5, each coupled to a DSG line 812 of DSG lines 0-5. All of the set of memory strings in the memory block are coupled to the same SSG line 816. Selected word line 814 represents a word line in the memory block selected for programming and verification.

The pulse scheme 602 is applied to the selected word line 814. The pulse scheme 602 includes fewer verification pulse 612 than program pulses 610. In some implementations, one or more selected memory strings are verified after being programmed, while the rest of the memory strings are not verified after being programmed. As an example, memory string 5 is verified after being programmed, and memory strings 0-4 are not verified after being programmed.

When applying a program pulse 610 to the selected word line 814 to program a memory string (e.g., memory string 0) of the memory block, a first select voltage 822 is applied to the DSG line 812 of the memory string to turn on the DSG transistors in the memory string, while an unselect voltage (e.g., ground voltage) is applied to DSG lines 812 of other memory strings (e.g., memory strings 1-5). As such, the memory string can be selected for programming, while the other memory strings are deselected for programming. In addition, when applying a verification pulse 612 to the selected word line 814 to verify a memory string (e.g., memory string 5) of the memory block, a second select voltage 824 is applied to the DSG line 812 of the memory string and a third select voltage 826 is applied to the SSG line 816, while an unselect voltage is applied to DSG lines 812 of other memory strings (e.g., memory strings 0-4). As such, the memory string can be selected for verification, while the other memory strings are deselected for verification. In some implementations, the first select voltage 822, the second select voltage 824 and the third select voltage 826 can be different in voltage value, for example, the second select voltage 824 can be larger than the first select voltage 822.

As an example shown in FIG. 8, a memory block that includes 6 memory strings can be programmed using 6 program pulses and verified using only one verification pulse. In a first time interval, the first program pulse is applied to the selected word line 814 to program memory string 0. When applying the first program pulse, the first select voltage 822 is applied to DSG line 0 coupled to memory string 0. In another time interval, the second program pulse is applied to the selected word line 814 to program memory string 1. When applying the second program pulse, the first select voltage 822 is applied to DSG line 1 coupled to memory string 1. In another time interval, the third program pulse is applied to the selected word line 814 to program memory string 2. When applying the third program pulse, the first select voltage 822 is applied to DSG line 2 coupled to memory string 2. In another time interval, the fourth program pulse is applied to the selected word line 814 to program memory string 3. When applying the fourth program pulse, the first select voltage 822 is applied to DSG line 3 coupled to memory string 3. In another time interval, the fifth program pulse is applied to the selected word line 814 to program memory string 4. When applying the fifth program pulse, the first select voltage 822 is applied to DSG line 4 coupled to memory string 4. In another time interval, the sixth program pulse is applied to the selected word line 814 to program memory string 5. When applying the sixth program pulse, the first select voltage 822 is applied to DSG line 5 coupled to memory string 5. After applying the six program pulses 610, a verification pulse 612 is applied to the selected word line to verify memory string 5. When applying the verification pulse 612, the second select voltage 824 is applied to DSG line 5, and the third select voltage 826 is applied to SSG line 816.

In some implementations, one or more different memory strings can be selected for verification. For example, memory string 2 can be selected for verification instead of memory string 5. In this case, after applying the third program pulse to program memory string 2, a verification pulse can be applied to the selected word line 814 to verify memory string 2. As another example, both memory string 2 and memory string 5 are selected for verification. In this case, after applying the third program pulse to program memory string 2, a verification pulse can be applied to the selected word line 814 to verify memory string 2, and after applying the six program pulses 610, a verification pulse 612 is applied to the selected word line to verify memory string 5.

Figure 9:
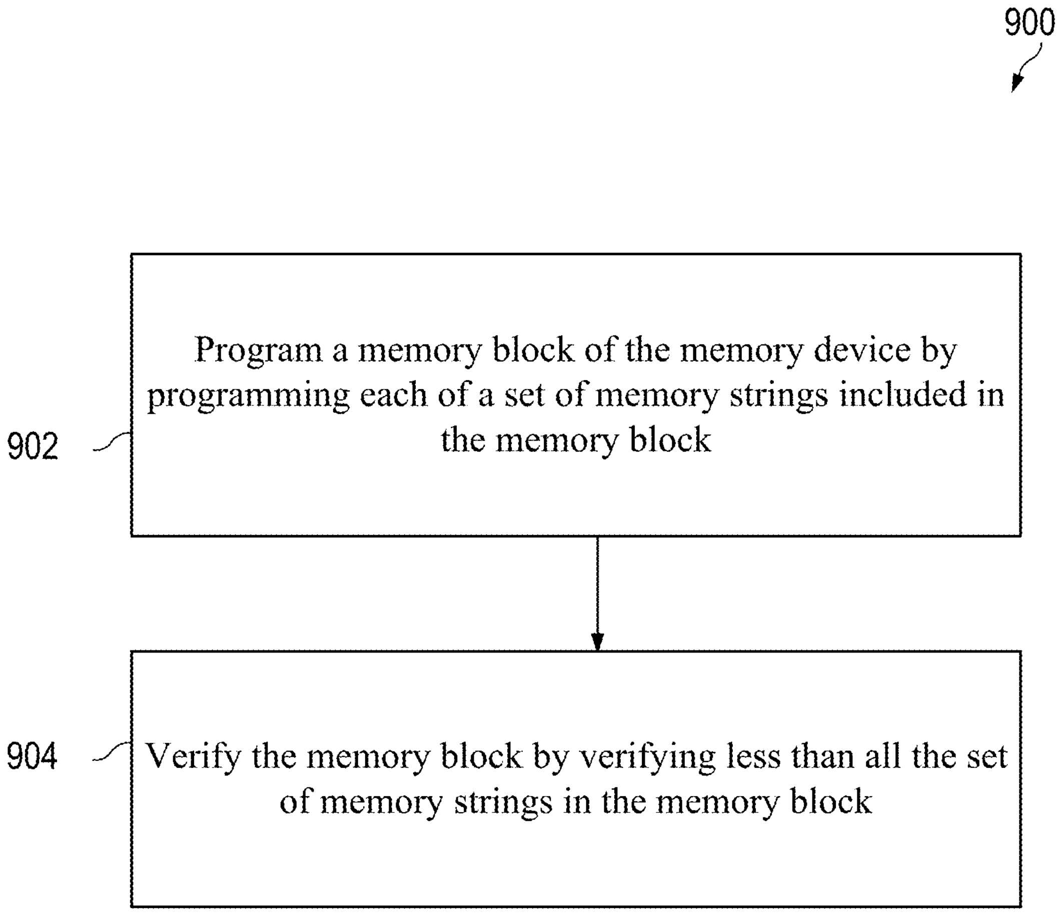
FIG. 9 illustrates an example of a flow chart of a method for performing a program operation in a memory device, according to some aspects of the present disclosure.

FIG. 9 illustrates a flow chart of an example process 900 for performing a program operation in a memory device, according to some aspects of the present disclosure. Process 900 can be performed by any suitable device or system as described herein, for example, according to the example techniques described with respect to FIGS. 1-8. For example, process 900 can be performed by a memory device, such as the memory device 100 of FIGS. 1 and 5 that includes a memory array 101. The memory array 101 can include one or more memory blocks (e.g., memory blocks 304) that each include a set of memory strings (e.g., memory string 134 of FIGS. 3-4). Memory cells, e.g., SLCs, in different memory strings are coupled by word lines. In some implementations, the memory device can also include peripheral circuits (e.g., peripheral circuits 102 of FIG. 1). The memory device can be a part of a memory system, such as memory system 1002 of FIG. 10. The program operation can be performed based on a pulse scheme (e.g., pulse scheme 602 of FIG. 6B) that includes fewer verification pulses than program pulses.

The operations shown in process 900 may not be exhaustive and that other operations can be performed as well before, after, or in between any of the illustrated operations. Further, some of the operations may be performed simultaneously, or in a different order than shown in FIG. 9. In some implementations, some of the operations may be performed by or one or more components of a device or a system, such as, a peripheral circuit of the memory device.

At 902, a memory block of the memory device is programmed by programming each of a set of memory strings included in the memory block. When programming a memory string of the set of the memory strings (e.g., a number of memory strings), a program pulse (e.g., program pulse 610 of FIG. 8) is applied to the word line coupled to memory cells of the memory string, and a select voltage (e.g., the select voltage 822 of FIG. 8) is applied to the DSG line of the memory string.

At 904, the memory block is verified by verifying less than all the set of memory strings in the memory block. In some implementations, one or more selected memory strings of the set of memory strings are verified, while the rest of the memory strings are not verified. The one or more selected memory strings can be verified after all the set of the memory strings are programmed, or can be verified immediately after the selected memory strings are programmed. When verifying a selected memory string, a verification pulse (e.g., verification pulse 612 of FIG. 8) is applied to the word line, a select voltage (e.g., the select voltage 824 of FIG. 8) is applied to the DSG line of the memory string, and a select voltage (e.g., the select voltage 826 of FIG. 8) is applied to the SSG line of the memory block. In some implementations, only one memory string of the set of memory strings is verified after being programmed. In some implementations, more than one memory string of the set of memory strings are verified after being programmed. By verifying the one or more selected memory strings, the memory device can determine whether the memory block is successfully programmed by determining a number of failed memory cells in the one or more selected memory strings.

Figure 10:
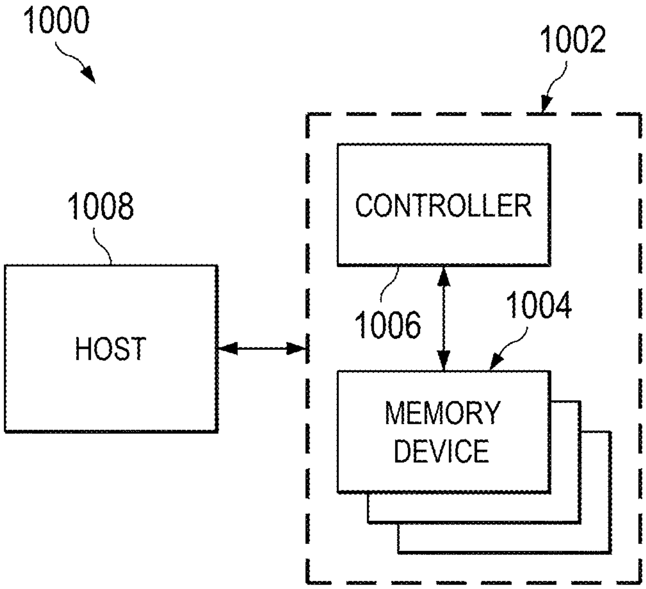
FIG. 10 illustrates a memory block diagram of an example system having a memory device, according to some aspects of the present disclosure.

FIG. 10 illustrates a memory block diagram of an example system 1000 having a memory device, according to some aspects of the present disclosure. System 1000 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. System 1000 can include a host 1008 and a memory system 1002 having one or more memory devices 1004 and a memory controller 1006. Host 1008 can be a processor of an electronic device, such as a central processing unit (CPU), or a system-on-chip (SoC), such as an application processor (AP). Host 1008 can be configured to send or receive data to or from memory devices 1004.

Memory device 1004 can be any memory device disclosed in the present disclosure. Memory controller 1006 is coupled to memory device 1004 and host 1008 and is configured to control the memory device 1004, according to some implementations. Memory controller 1006 can manage the data stored in memory device 1004 and communicate with host 1008. In some implementations, memory controller 1006 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1006 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1006 can be configured to control operations of memory device 1004, such as read, erase, and program operations. Memory controller 1006 can also be configured to manage various functions with respect to the data stored or to be stored in memory device 1004 including, but not limited to bad-memory block management, garbage collection, logical-to-physical address conversion, wear leveling, etc. In some implementations, memory controller 1006 is further configured to process error correction codes (ECCs) with respect to the data read from or written to memory device 1004. Any other suitable functions may be performed by memory controller 1006 as well, for example, formatting memory device 1004.

Memory controller 1006 can communicate with an external device (e.g., host 1008) according to a particular communication protocol. For example, memory controller 1006 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 11A:
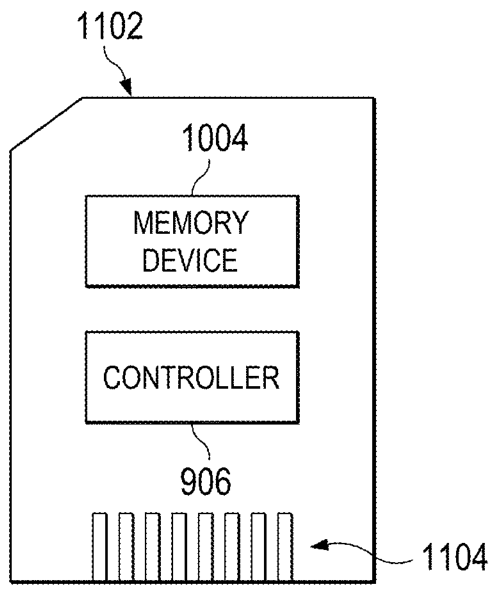
FIG. 11A illustrates a diagram of a memory card having a memory device, according to some aspects of the present disclosure.
Figure 11B:
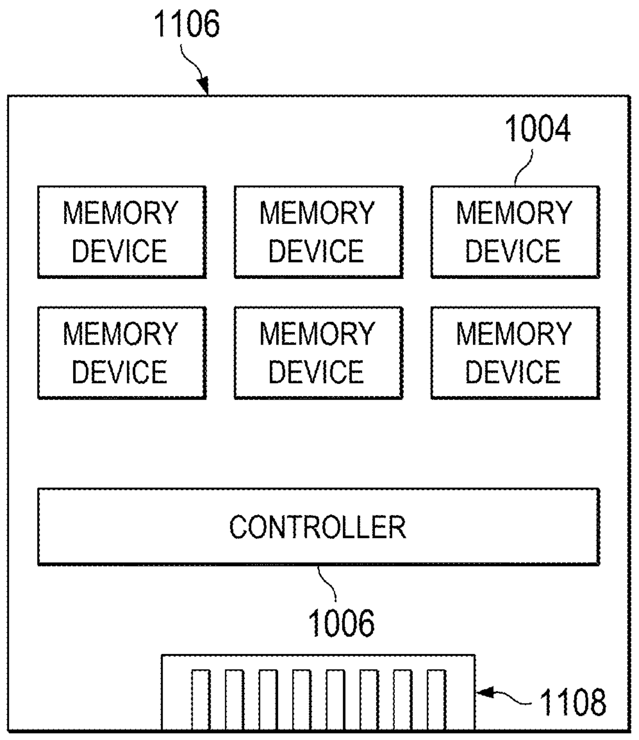
FIG. 11B illustrates a diagram of a solid-state drive (SSD) having a memory device, according to some aspects of the present disclosure.

Memory controller 1006 and one or more memory devices 1004 can be integrated into various types of storage devices. For example, memory controller 1006 and one or more memory devices 1004 can be packaged in a universal Flash storage (UFS) package or an eMMC package. In one example as shown in FIG. 11A, memory controller 1006 and a single memory device 1004 may be integrated into a memory card 1102. Memory card 1102 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1102 can further include a memory card connector 1104 coupling memory card 1102 with a host (e.g., host 1008 in FIG. 10). In another example as shown in FIG. 11B, memory controller 1006 and multiple memory devices 1004 may be integrated into an SSD 1106. SSD 1106 can further include an SSD connector 1108 coupling SSD 1106 with a host (e.g., host 1008 in FIG. 10). In some implementations, the storage capacity and/or the operation speed of SSD 1106 is greater than those of memory card 1102.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A method for operating a memory device, comprising:

programming a memory block of the memory device by programming each memory string of a set of memory strings comprised in the memory block, wherein each memory string of the set of memory strings is coupled to a respective select line; and verifying the memory block by verifying less than all memory strings of the set of memory strings.

2. The method of claim 1, further comprising:

determining a number of failed memory cells in the less than all memory strings of the set of memory strings in the memory block; and determining whether the programming of the memory block is successful based on the number of failed memory cells.

3. The method of claim 1, wherein programming the memory block comprises programming the set of memory strings using a set of program pulses, wherein verifying the memory block comprises verifying the less than all memory strings of the set of memory strings using one or more verification pulses, and wherein a quantity of the one or more verification pulses is less than a quantity of the set of program pulses.

4. The method of claim 1, wherein programming the memory block comprises programming the set of memory strings by applying a set of program pulses to a word line coupled to memory cells of the set of memory strings, and wherein verifying the memory block comprises verifying only one memory string of the set of memory strings by applying one verification pulse to the word line.

5. The method of claim 3, wherein verifying less than all memory strings of the set of memory strings in the memory block comprises:

identifying one or more selected memory strings of the set of memory strings; and verifying the one or more selected memory strings by applying the one or more verification pulses.

6. The method of claim 5, further comprising reading configuration data from a register of the memory device, wherein the configuration data indicate the one or more selected memory strings.

7. The method of claim 3, wherein a first memory string of the less than all memory strings of the set of memory strings is programmed using a first program pulse of the set of program pulses, wherein the first memory string is verified using a first verification pulse of the one or more verification pulses, and wherein the first verification pulse immediately follows the first program pulse.

8. The method of claim 1, wherein the memory block comprises single-level cells.

9. The method of claim 1, wherein programming each memory string of the set of memory strings comprised in the memory block comprises:

applying a first program pulse to a word line to program first memory cells of a first memory string, wherein the word line is coupled to the first memory cells in the first memory string and second memory cells in a second memory string, wherein the first memory string and the second memory string are comprised in the memory block; and applying a second program pulse to the word line to program the second memory cells of the second memory string, and wherein verifying less than all memory strings of the set of memory strings in the memory block comprises applying a verification pulse to the word line to verify one of the first memory string or the second memory string, wherein the second program pulse and the first program pulse are applied consecutively, and the verification pulse is applied after the second program pulse.

10. The method of claim 9, wherein programming each memory string of the set of memory strings comprises, when applying the first program pulse:

applying a first voltage to a first select line coupled to a first select gate transistor of the first memory string; and applying a ground voltage to a second select line coupled to a second select gate transistor of the second memory string.

11. The method of claim 10, wherein programming each memory string of the set of memory strings comprises, when applying the second program pulse:

applying the ground voltage to the first select line; and applying the first voltage to the second select line.

12. The method of claim 10, wherein verifying less than all memory strings of the set of memory strings in the memory block comprises, when applying the verification pulse:

applying a second voltage to one of the first select line or the second select line; and applying the ground voltage to another one of the first select line or the second select line.

13. The method of claim 12, wherein the second voltage is higher than the first voltage.

14. A memory device, comprising:

a memory array comprising a memory block, wherein the memory block comprises a set of memory strings; and a peripheral circuit coupled to the memory array and configured to perform operations comprising:

programming the memory block by programming each memory string of the set of memory strings, wherein each memory string of the set of memory strings is coupled to a respective select line; and verifying the memory block by verifying less than all memory strings of the set of memory strings.

15. The memory device of claim 14, wherein the operations further comprise:

determining a number of failed memory cells in the less than all memory strings of the set of memory strings in the memory block; and determining whether the programming of the memory block is successfully based on the number of failed memory cells.

16. The memory device of claim 14, wherein programming the memory block comprises programming the set of memory strings using a set of program pulses, wherein verifying the memory block comprises verifying the less than all memory strings of the set of memory strings using one or more verification pulses, and wherein a quantity of the one or more verification pulses is less than a quantity of the set of program pulses.

17. The memory device of claim 14, wherein programming the memory block comprises programming the set of memory strings by applying a set of program pulses to a word line coupled to memory cells of the set of memory strings, and wherein verifying the memory block comprises verifying only one memory string of the set of memory strings by applying one verification pulse to the word line.

18. The memory device of claim 16, wherein verifying less than all memory strings of the set of memory strings in the memory block comprises:

identifying one or more selected memory strings of the set of memory strings; and verifying the one or more selected memory strings by applying the one or more verification pulses.

19. The memory device of claim 18, wherein the operations comprise reading configuration data from a register of the memory device, wherein the configuration data indicate the one or more selected memory strings.

20. A memory system, comprising:

a memory device comprising a memory array and a peripheral circuit coupled to the memory array, wherein the peripheral circuit is configured to perform operations comprising:

programming a memory block of the memory array by programming each memory string of a set of memory strings comprised in the memory block, wherein each memory string of the set of memory strings is coupled to a respective select line; and verifying the memory block by verifying less than all memory strings of the set of memory strings in the memory block; and a memory controller coupled to the memory device and configured to control the memory device.

* * * * *